Figure 1:
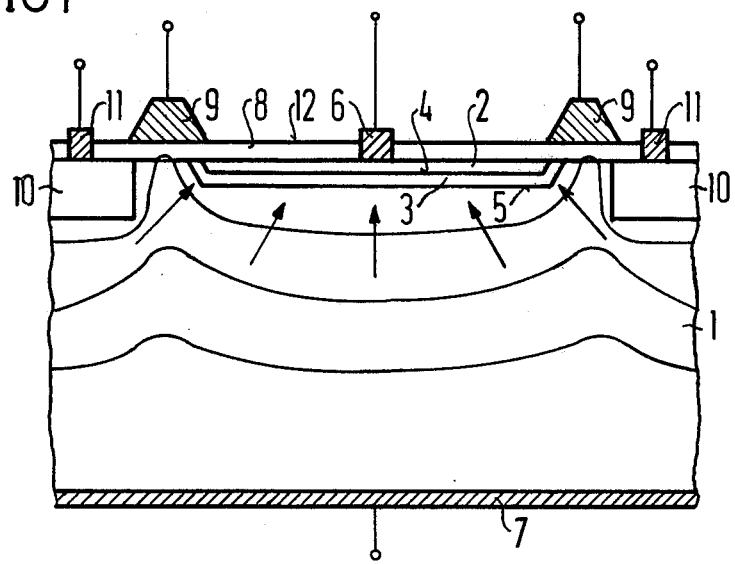

United States Patent [19]

Tihanyi

[11] 4,355,320

[45] Oct. 19, 1982

[54] LIGHT-CONTROLLED TRANSISTOR

[75] Inventor: Jenö Tihanyi, Munich, Fed. Rep. of Germany

[73] Assignee: Siemens Aktiengesellschaft, Berlin and Munich, Fed. Rep. of Germany

[21] Appl. No.: 153,900

[22] Filed: May 28, 1980

[30] Foreign Application Priority Data

May 31, 1979 [DE] Fed. Rep. of Germany ....... 2922250

[51] Int. Cl.³ ............................................. H01L 27/14
[52] U.S. Cl. ...................................... 357/30; 357/23; 357/52; 357/91
[58] Field of Search ........................ 357/30, 23, 52, 91

[56] References Cited

U.S. PATENT DOCUMENTS 3,742,318  6/1973  Yamashita ....................... 357/30 X
4,107,721  8/1978  Miller .................................... 357/30
4,110,779  8/1978  Rathbone ......................... 357/91 X

*Primary Examiner*—Martin A. Edlow
*Attorney, Agent, or Firm*—Herbert L. Lerner; Laurence A. Greenberg

[57] ABSTRACT

Light-controlled transistor, including a semiconductor body having a surface including a given area intended for the incidence of light, a collector zone, and a base zone and an emitter zone each having a smaller area than the semiconductor body, each of the base and collector zones having at least a part thereof emerging to the surface, a pn-junction disposed between the base and emitter zones and a pn-junction disposed between the base and collector zones, each of the pn-junctions emerging to the surface at the given area, and at least one auxiliary electrode disposed on and electrically insulated from the surface, the auxiliary electrode covering at least the parts of the base and collector zones emerging to the surface, the auxiliary electrode being connectible to an auxiliary voltage having the same polarity as the emitter bias.

4 Claims, 2 Drawing Figures

LIGHT-CONTROLLED TRANSISTOR

The invention relates to a light-controlled transistor, comprising a semiconductor body, the base and emitter zones of which have a smaller area than the semiconductor body and in which the pn-junctions located between the base and the emitter zone and between the base and the collector zone emerge to the surface of the semiconductor body in the area intended for the incidence of the light.

Such a transistor has already been described in the prior art. In this transistor, the base and emitter zones are prepared by the planar technique. The base is kept as small as possible in order to increase the current density. In a light-controlled transistor of this type, it is important that as large a part as possible of the charge carriers which are generated by the light flows to the base. In the case of the planar structure mentioned hereinafore, this requirement is in particular not met per se, if the transistor is part of an integrated circuit. This is because in integrated circuits a large part of the charge carriers generated by the incidence of the light can flow to other parts of the circuit, by-passing the base of the transistor. It is also possible for interference currents which are independent of the light to flow from the circuit to the base.

It is accordingly an object of the invention to provide a light-controlled transistor which overcomes the hereinafore-mentioned disadvantages of the heretofore-known devices of this general type, and to do this in such a way that as many charge carriers as possible, which are generated in the space charge zone through the indidence of the light, flow to the base of the transistor. According to a further embodiment, light-independent interference currents are also to be kept away from the base.

With the foregoing and other objects in view, there is provided, in accordance with the invention, a light-controlled transistor, comprising a semiconductor body having a surface including a given area intended for the incidence of light, a collector zone, and a base zone and an emitter zone each having a smaller area than the semiconductor body, each of the base and collector zones having at least a part thereof emerging to the surface, a pn-junction disposed between the base and emitter zones and a pn-junction disposed between the base and collector zones, each of the pn-junctions emerging to the surface at the given area, and at least one auxiliary electrode disposed on and electrically insulated from the surface, the auxiliary electrode covering at least the parts of the base and collector zones emerging to the surface, the auxiliary electrode being connectible to an auxiliary voltage having the same polarity as the emitter bias.

In accordance with another feature of the invention, the auxiliary electrode is formed of highly doped polycrystalline silicon and has a thickness which is light permeable.

In accordance with a further feature of the invention, there is provided an insulating layer formed of silicon dioxide disposed between the auxiliary electrode and the surface.

In accordance with an added feature of the invention, there is provided at least one auxiliary zone of the same conduction type as the base zone, the auxiliary zone being embedded in the semiconductor body and being spaced at a lateral distance from the emitter and base zones, the auxiliary zone being thicker than the base and emitter zones combined and being connectible to an auxiliary voltage of the same polarity as the emitter bias.

In accordance with an additional feature of the invention, the emitter and base zones are divided into a plurality of sub-zones, and the at least one auxiliary electrode comprises a plurality of auxiliary electrodes disposed on the given area, the auxiliary electrodes being connected to each other and covering at least the parts of the base sub-zones and the collector zone emerging to the surface.

In accordance with a concomitant feature of the invention, the auxiliary electrodes have flanks disposed thereon being bevelled toward an edge thereof, the auxiliary electrodes forming ion implantation masks for the emitter and base zones.

Other features which are considered as characteristic for the invention are set forth in the appended claims.

Although the invention is illustrated and described herein as embodied in a light-controlled transistor, it is nevertheless not intended to be limited to the details shown, since various modifications and structural changes may be made therein without departing from the spirit of the invention and within the scope and range of equivalents of the claims.

Figure 2:
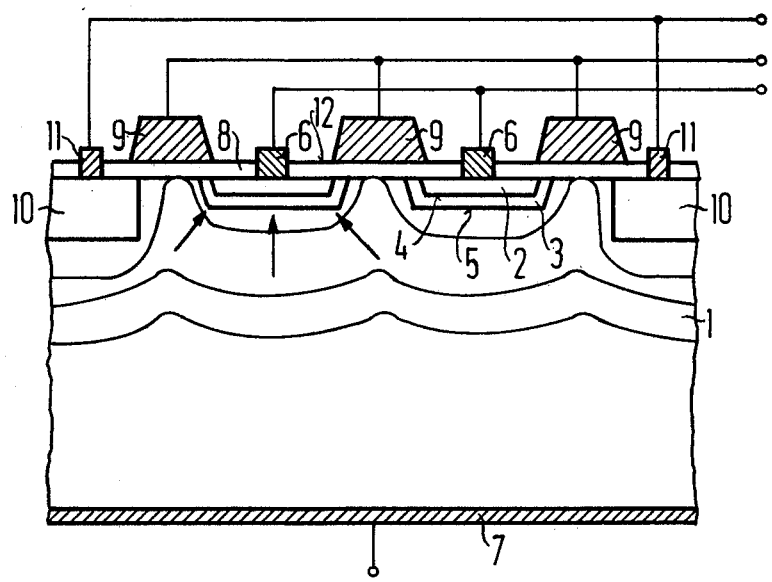

The construction and method of operation of the invention, however, together with additional objects and advantages thereof will be best understood from the following description of specific embodiments when read in connection with the accompanying drawings, in which:

FIG. 1 is a diagrammatic cross-sectional view of a first embodiment of the light-controlled transistor of the invention; and FIG. 2 is a view similar to FIG. 1 of another embodiment of the invention.

Referring now to the figures of the drawing and first particularly to FIG. 1 thereof, there is seen a light-controlled transistor shown in cross section which comprises a collector zone 1, an emitter zone 2 and a base zone 3. The pn-junctions 4, 5, which emerge to the surface of the transistor at the area intended for the incidence of light, are located between the zones 2 and 3, and 3 and 1, respectively. The zones 1, 2 and 3 therefore emerge likewise to the main surface 12. The area of the emitter zone 2 as well as the area of the base zone 3 are smaller than that of the semiconductor body. The emitter zone 2 and the collector zone 1 are provided with an emitter electrode 6 and a collector electrode 7, respectively, as contacts. The surface of the transistor is covered with an insulating layer 8, which may be formed of silicon dioxide, for instance. On this insulating layer 8, there are disposed auxiliary electrodes 9, which cover the parts of the base zone 3 and the collector zone 1 emerging to the surface of the semiconductor body. Laterally adjacent to the base and emitter zones, there are seen auxiliary zones 10 which can be embedded in the surface of the semiconductor body. These zones are of the opposite conduction type as the emitter zone 2. The auxiliary zones 10 are provided with auxiliary electrodes 11 used as contacts. It is advantageous if their thickness is larger than the thickness of the emitter zone 2 plus the base zone 3.

For operating the transistor, a bias is supplied to the electrodes 6,7 which in the case of an npn-zone sequence at the emitter is negative relative to the collector. At the same time an auxiliary voltage which is likewise negative relative to the collector and is, for instance, as large as the emitter voltage, is applied to the auxiliary electrodes 9. If additionally, the auxiliary zone 10 is provided in the semiconductor body, it is likewise connected through the electrode 11 to a voltage which is negative relative to the collector and is, for instance, of the same magnitude as the emitter bias. In the transistor there is then developed a space-charge zone, the shape of which is indicated by the equipotential lines shown in the figure. If the auxiliary zone 10 were omitted, the equipotential lines would drop somewhat less steeply toward the edge of the section of the illustrated semiconductor body. If light now falls on the area 12 intended for the incidence of the light, pairs of charge carriers are generated in the space charge zone. The holes of these pairs migrate toward the pn-junction 5 due to the negative emitter bias. They then excite emission of charge carriers from the emitter 2 and the transistor is switched on. Due to the shape of the equipotential lines, the holes move from the space charge zone toward the pn-junction 5 from all sides and flow toward further structures which may also be integrated in the semiconductor body only to a negligibly small extent. This raises the efficiency of the light-controlled transistor and in turn its gain therefore becomes large as well, so that even a relatively weak light signal produces a strong signal. In addition, the base is shielded against interference currents coming from other parts of the circuit.

The transistor in FIG. 2 differs from that according to FIG. 1 substantially in that the emitter zone 2 and the base zone 3 in FIG. 2 are subdivided into sub-zones. The emitter sub-zones are each provided with an emitter electrode 6 used as the contact. On the area 12, several auxiliary electrodes 9 are accordingly provided. These electrodes cover the parts of the base zone 3 and the collector zone 1 emerging to the surface of the semiconductor body. If light falls on the area 12, the holes thus generated flow toward the pn-junctions 5 in accordance with the equipotential lines shown in the drawing and there release the emission of electrons from the individual emitter sub-zones 2, as in the embodiment example according to FIG. 1. Each of the auxiliary electrodes 9, emitter electrodes 6 and auxiliary electrodes 11 are connected to each other.

For higher powers, it is advisable to combine a multiplicity of the structures shown in FIG. 1 or 2 in an arrangement which is disposed in raster-fashion on a large chip. The emitter electrodes 6 as well as the auxiliary electrodes 9 and, if applicable, the auxiliary electrode 11, are then connected to each other by conductor runs, as is customary in integrated circuits.

In order to prevent the incidence of light on the area 12 from becoming excessively impeded, the auxiliary electrodes 9 which may be formed, for instance, of highly doped polycristalline silicon, are made so thin that the incident light is only insignificantly attenuated. The auxiliary electrodes may, for instance be 0.1 to 1 $\mu$m thick. The emitter zone 2 and the base zone 3 can be made, for instance, with a thickness of 0.1 $\mu$m and 0.4 $\mu$m, respectively, by ion implantation. To this end it is advantageous to give to the auxiliary electrodes 9 slanted flanks so that they act as a mask for the ion implantation of the emitter zone 2 and base zone 3 and the shape illustrated as rising upward at an angle, is obtained. The distance between the sub-emitter zones and the width of the auxiliary electrode 9 may be for instance, 50 $\mu$m, while the width of the emitter sub-zones 2 can be, for instance, around 5 $\mu$m. The doping of the emitter zone 2 may be between $10^{18}$ and $10^{20}$ cm$^{-3}$ and is produced by means of ion implantation with a dose of 2 to $5 \times 10^{12}$ cm$^{-2}$ and an energy of, for instance, 150 to 200 keV. For the implantation of the base zone 3, a dose of 2 to $6 \times 10^{12}$ cm$^{-2}$ and an energy of 100 to 200 keV are required. The auxiliary zone 10 is produced by diffusion. It may be, for instance, 10 $\mu$m deep and have a concentration of $10^{17}$ cm$^{-3}$ at the surface. The thickness of the semiconductor body is, for instance, around 250 to 500 $\mu$m. The doping of the zone 1 is about $10^{14}$ to $10^{15}$ cm$^{-3}$.

The embodiment examples show complete coverage of the parts of the base zone and the collector zone emerging to the surface by the auxiliary electrodes. In principle the same, but a weaker effect is obtained if the auxiliary electrodes only partially cover the zones with respect to their lengths or widths.

There are claimed:

1. Light-controllable transistor, comprising a semiconductor body having a surface including a given area intended for the incidence of light, a collector zone, and a base zone and an emitter zone each having a smaller area than said semiconductor body, each of said base and collector zones having at least a part thereof emerging to said surface, a pn-junction disposed between said base and emitter zones and a pn-junction disposed between said base and collector zones, each of said pn-junctions emerging to said surface at said given area, at least one auxiliary electrode disposed on and electrically insulated from said surface, said auxiliary electrode covering at least said parts of said base and collector zones emerging to said surface, said auxiliary electrode being connectible to an auxiliary voltage having the same polarity as the emitter bias, and at least one auxiliary zone of the same conduction type as said base zone, said auxiliary zone being embedded in said semiconductor body and being spaced at a lateral distance from said emitter and base zones, and said auxiliary zone being connectible to an auxiliary voltage of the same polarity as the emitter bias.

2. Light-controllable transistor according to claim 1, wherein said collector, emitter and base zones are in the form of an array of emitter zones and associated base zones with a common collector zone, and said at least one auxiliary electrode comprises a plurality of auxiliary electrodes disposed on said given area, said auxiliary electrodes being connected to each other and covering at least said parts of said base zones and said collector zone emerging to said surface.

3. Light-controllable transistor according to claim 1, wherein said auxiliary electrodes have sides disposed thereon being bevelled outwardly toward the opposite end thereof, said auxiliary electrodes forming ion implantation masks for said emitter and base zones.

4. Light-controllable transistor according to claim 1, wherein said auxiliary zone is thicker than said base and emitter zones combined.

* * * * *